United States Patent [19]

Berger

[11] 3,757,245

[45] Sept. 4, 1973

[54] TEMPERATURE COMPENSATED FIELD EFFECT TRANSISTOR CRYSTAL OSCILLATOR

[75] Inventor: Robert L. Berger, Raytown, Mo.

[73] Assignee: Western Electric Company, Incorporated, New York, N.Y.

[22] Filed: June 2, 1972

[21] Appl. No.: 259,321

[52] U.S. Cl. .................... 331/66, 330/35, 331/109, 331/116 R, 331/176

[51] Int. Cl. .................... H03b 5/36

[58] Field of Search .................... 331/66, 108 R, 109, 331/116 R, 176; 330/35

[56] References Cited

UNITED STATES PATENTS 3,543,186 11/1970 Flaig .................... 331/176 X 3,404,298 10/1968 Roberts .................... 331/176 X 3,462,710 8/1969 Watase .................... 331/116 R 3,624,541 11/1971 Lundstrom .................... 331/109 X

*Primary Examiner*—Roy Lake

*Assistant Examiner*—Siegfried H. Grimm

*Attorney*—W. M. Kain et al.

[57] ABSTRACT

A temperature-compensated field-effect transistor crystal oscillator includes a first impedance with a capacitive component having a negative temperature coefficient in a feedback loop of the oscillator and a second impedance with a resistive component having a negative temperature coefficient in the output loop of the oscillator. The impedances minimize temperature-dependent variations from the characteristic frequency of the oscillator.

4 Claims, 3 Drawing Figures

PATENTED SEP 4 1973

3,757,245

TEMPERATURE COMPENSATED FIELD EFFECT TRANSISTOR CRYSTAL OSCILLATOR

BACKGROUND OF THE INVENTION

1. Field of the Invention

This invention relates to a field-effect transistor crystal oscillator circuit and, particularly, to the incorporation of circuit elements having temperature-dependent characteristics into such oscillator circuit for altering the temperature-dependent operating frequency of the circuit to stablize such operating frequency over its entire operating range.

2. Discussion of the Prior Art

Elements such as resistors or capacitors usually have temperature-dependent characteristics. The values of these elements vary when their temperature changes. In oscillators, such a variation brings about a related variation in the characteristic frequency of the oscillator.

To minimize the temperature-dependent frequency changes of an oscillator, an inductor and a capacitor of a resonant circuit is advantageously replaced by a piezoelectric crystal. Such a crystal sustains electrical oscillations at its natural mechanical frequency. A temperature-dependent change in oscillating frequency of the crystal in a circuit is minimal and depends on the cut of the crystal.

A known oscillator circuit uses a piezoelectric crystal of the type commonly referred to as "C" cut crystal. The circuit, including a pentode vacuum tube has a well-defined, bell-shaped temperature-dependent frequency variation over its normal operating range. Its characteristic frequency is highest near the center of a normal, temperature-variable operating range and decreases slightly toward either temperature extreme of such range. The advantage of such a temperature-dependent characteristic frequency is that the variation from a mean over the major portion of the effective operating range is only slight. The variation becomes more pronounced only at the very extremes of the operating range.

The above-described characteristic frequency is obtained from an oscillator circuit including a pentode vacuum tube. Several advantages are obtained when the vacuum tube is replaced by a junction field-effect transistor circuit. Such a field-effect transistor circuit is either a single junction field-effect transistor or a cascoded arrangement of two such transistors as described in a publication of *Electrical Design News* Sept. 14, 1966, in an article entitled "Designing with FETS in Cascode." The transistor replacement circuit does not require the cathode heater found in a pentode vacuum tube. Furthermore, characteristics of the replacement circuit experience less change with time than the characteristics of the replaced vacuum tube. Finally, the replacement circuit has a longer life span than the vacuum tube.

However, in replacing the pentode vacuum tube with such a transistor circuit, the temperature-dependent characteristic frequency of the oscillator circuit is changed. Instead of a bell-shaped curve which is typical of the pentode oscillator circuit with the C-cut crystal, the transistor oscillator circuit exhibits a linear frequency variation over the entire operating range of the circuit, having its highest frequency at the low temperature end of such range. The frequency decreases from there steadily toward the high temperature end of the operating range. This steady change over the operating range brings about a substantial frequency difference between temperature extremes.

It is desirable to decrease the frequency difference of the transistor oscillator circuit between temperature extremes of the operating range.

It is further desirable and advantageous to align the frequency variation of the transistor oscillator circuit with the variation of the pentode oscillator circuit to make the two circuits compatible and, consequently, interchangeable with each other.

SUMMARY OF THE INVENTION

It is, therefore, an object of the invention to alter the temperature-dependent operating frequency of a field-effect transistor oscillator increasingly downward with decreasing operating temperatures in a temperature range below zero degrees centigrade.

Another object of the invention is to provide circuit components in a transistor oscillator circuit which maximize the temperature-dependent operating frequency of the oscillator circuit near the center of the operating range of the circuit and lower the characteristic frequency of the oscillator circuit at the low temperature end of the operating range of circuit.

With these and other objects in view, the present invention contemplates a capacitive impedance having a negative temperature coefficient, inserted in a feedback loop of a crystal oscillator circuit, a field-effect transistor device having a drain, a gate, and a source, as the active element of the circuit, and a provision for increasingly limiting, with decreasing operating temperatures of the circuit, a current flow through the transistor device.

Other objects and advantages of the present invention will become apparent from the following detailed description and the accompanying drawing.

DETAILED DESCRIPTION OF THE INVENTION

Figure 1:
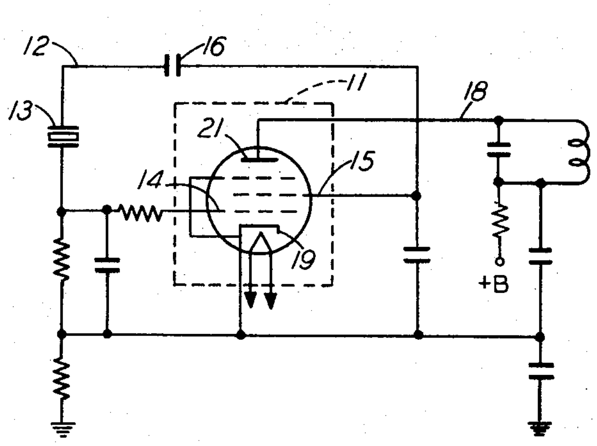
FIG-1 (PRIOR ART)
FIG. 1 shows a crystal oscillator circuit of the prior art.

Referring now to FIG. 1, there is shown a prior art oscillator circuit including a pentode vacuum tube 11 as an active element of the circuit. An oscillator loop 12 includes a crystal 13 and has an output connected to a control grid 14 of the vacuum tube 11. A screen grid 15 of the vacuum tube 11 is coupled through a capacitor 16 to the crystal 13 to supply the oscillator loop 12 with a feedback signal. An output loop 18 of the oscillator circuit shown in FIG. 1 is coupled to a cathode 19 and a plate 21 of the vacuum tube 11. The signal in the output loop is consequently controlled by the signal applied to the control grid 14 of the vacuum tube.

Figure 2:
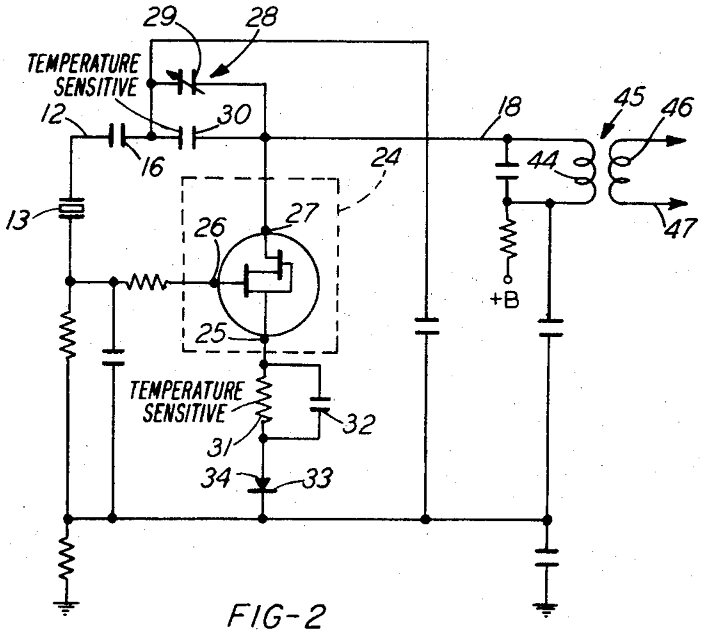
FIG. 2 shows a temperature compensated field-effect transistor oscillator circuit.

FIG. 2 shows an oscillator circuit of the present invention, having a junction-field-effect transistor circuit 24 as an active element. Connections to the circuit 24 are made at a source 25, a gate 26 and a drain 27 which correspond to the cathode 19, the control grid 14 and the plate 21, respectively, in the above-described circuit of FIG. 1.

Since there is no connection in the transistor circuit 24 which is equivalent to the screen grid connection 15 in the vacuum tube circuit of FIG. 1, a feedback coupling is made between the drain 27 and the oscillator loop 12 through an impedance designated generally by numeral 28. The impedance 28 is capacitive.

In both, the pentode circuit in FIG. 1 and the transistor circuit in FIG. 2, a direct current bias supply voltage is coupled in a conventional manner to the oscillator circuits where needed. Typical bias voltage connections are shown in FIGS. 1 and 2 designated by the symbol +B.

The preferred embodiment in FIG. 2 shows an adjustable capacitor element 29 which is coupled in parallel to another capacitive element or capacitor 30 having a negative temperature coefficient. The capacitor 30 experiences an increase in capacitance as its operating temperature decreases.

It has been found that an increase in capacitance of the coupling impedance 28 decreases the operating frequency of the oscillator in FIG. 2. As the operating temperature of the circuit in FIG. 2 decreases, the increase in capacitance of the capacitor 30 tends to lower the oscillating frequency of the frequency-controlling oscillator loop 12.

The characteristic frequency of the oscillator loop 12 in FIG. 2 is further decreased by a resistive element having a negative temperature characteristic, which is referred to as a thermistor 31, coupled to the source 25 of the transistor circuit 24. As the operating temperature of the oscillator decreases, the resistance of the thermistor 31 increases to reduce the current flow through the transistor circuit 24 and, also, to raise the steady state voltage of the drain 27 with respect to ground.

The signal voltages are not affected by the thermistor 31 because the thermistor 31 is by-passed by a capacitor 32 which is coupled into the oscillator circuit in FIG. 2 in parallel with the thermistor 31. A diode 33 is coupled in series with the thermistor 31 and the capacitor 32 to the source 25 of the transistor circuit 24. An anode 34 of the diode 33 is coupled to the source 25 of the circuit 24 to prevent a conventional current flow into the source 25 of the circuit 24.

Variations in choosing the temperature coefficients of the capacitor 30 and the thermistor 31 are permissible. However, a most satisfactory result is obtained by (using a commonly accepted method of specifying changes in characteristics of elements in parts per million) a change in capacitance amounting to 1,000 parts per million per degree centigrade. A preferred change in resistance of the thermistor 31 is a variation in a range from greater than 700 ohms at a negative 40 degrees centigrade (−40°C) to less than 20 ohms at a temperature of 60 degrees centigrade (60°C).

Figure 3:
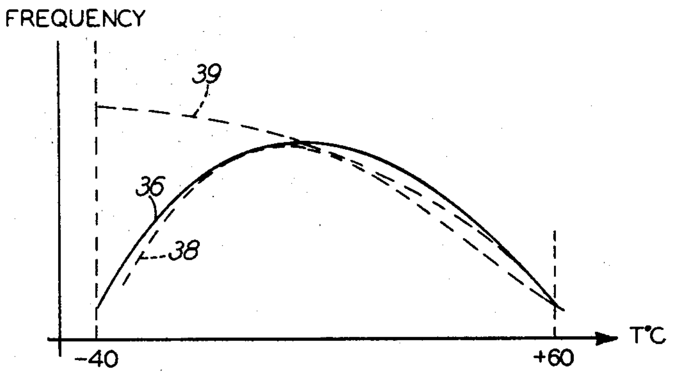
FIG. 3 is a comparative graph between the temperature-dependent characteristics of the prior art and an embodiment of the invention.

FIG. 3 compares the temperature-dependent frequency characteristic of the oscillator circuit of FIG. 1 with the temperature-dependent frequency characteristic of the compensated transistor circuit of FIG. 2. Particularly, curve 36 shows the frequency variation of the circuit of FIG. 1 and curve 38 shows the variation of the compensated circuit shown in FIG. 2. Curve 39 shows the frequency variation of a transistor circuit as shown in FIG. 2 but without the inclusion of the temperature-compensating elements, the capacitor 30 and the thermistor 31.

The temperature range shown in FIG. 3 extends from −40°C to +60°C. This constitutes what is considered to be a practical temperature range for the operation of the oscillator circuit. The temperature variation of FIG. 3 is shown on a linear scale along the horizontal axis of the graph. On the vertical frequency axis of the graph no particular frequency has been specified since the frequency of the oscillator circuit is not defined by a particular frequency. The oscillating frequency of the circuit varies depending on the natural frequency response of the particular crystal 13 in the circuit 12.

The effect of the temperature-compensating impedance 28 and the thermistor 31 can be better understood by describing a cycle of operation of the oscillator in FIG. 2. Arbitrarily, the beginning of the cycle is chosen with a peak voltage at the drain 27 of the transistor circuit 24.

The voltage at the drain 27 is applied through the impedance 28 and the capacitor 16 to the crystal 13. A current flow through the crystal 13 results in response to the applied voltage. The current flow through the crystal 13 causes a positive voltage transition at the gate 26.

The positive voltage transition at the gate 26 renders the circuit 24 increasingly conductive between the drain 27 and the source 25. An increasing current flow between the drain 27 and the source 25 drives the voltage at the drain 27 downward.

The decreased voltage at the drain 27 lowers the voltage across the impedance 28. This voltage change is applied to the crystal 13 to reverse the current flow through the crystal 13. This reversal, in turn, decreases the voltage at the gate 26.

The decrease of the gate voltage renders the circuit 24 increasingly non-conductive between the drain 27 and the source 25. The current flow through the circuit 24 decreases as a result of the change in conductance in the circuit 24. Consequently, the voltage at the drain 27 increases, again, to the peak value of the beginning of the cycle.

As the voltage at the drain 27 changes in the above-described manner, a correspondingly varying voltage appears across a primary coil 44 of an output transformer designated generally by numeral 45. A resulting signal current through the primary coil 44 induces a similar current in a secondary coil 46 coupled into a signal line 47.

The crystal 13 in the oscillator loop 12 controls the frequency of the above-described cycle. Ideally, the frequency of operation is that of the natural mechanical frequency of the crystal. However, electrical loading of the crystal 13 affects the operating frequency of the crystal 13 and the oscillator loop 12.

The crystal 13 becomes electrically loaded, when an increasingly larger current is forced through the crystal. A larger crystal current increases the operating frequency of the crystal 13.

With decreasing operating temperatures of the oscillator of FIG. 2 the capacitance of the impedance 28 increases.

The increasing capacitance compensates for changes in the magnitude of the current through the crystal 13 to permit the crystal 13 to oscillate at its natural frequency. As illustrated in FIG. 3, the compensating effect of the impedance 28 is particularly noticeable at operating temperatures of the oscillator which lie below zero degrees centigrade (0°C).

The change in the capacitance of the impedance 28 affects the signal voltages and the signal current flow through the oscillator loop 12. The resulting decrease in the characteristic frequency of the oscillator loop 12 substantially approaches the characteristic frequency of the pentode oscillator of FIG. 1.

While the impedance 28 substantially changes the operating frequency to the desired characteristic frequency at low temperatures, the thermistor 31 further improves such frequency. The thermistor 31 affects the current flow through the circuit 24 by influencing the bias voltages applied to the circuit 24.

As the operating temperature of the oscillator circuit of FIG. 2 decreases, the resistance of the thermistor 31 increases substantially. This increase in resistance raises the voltage at the source 25 and the gate 26 with respect to the battery voltage supplied to the drain 27. The increase in the source voltage during maximum current flow between the drain 27 and the source 25 limits the voltage extremes applied to the coupling impedance 28. Limiting the voltage extremes controls the current flow through the crystal 13 and ultimately influences the frequency of the oscillator circuit shown in FIG. 2.

The above description is primarily confined to the exemplary circuit shown in FIG. 2. Reference to such circuit is not to be interpreted as a limitation to the scope of the invention. Modifications in the oscillator circuit are possible without affecting the spirit and scope of the invention.

What is claimed is:

1. A crystal-controlled oscillator circuit having an oscillator loop including a capacitance and a piezoelectric crystal to provide oscillating signals, and an output loop including means for applying signals to a signal line, wherein an improvement comprises:

a junction field-effect transistor circuit having a source, a gate, and a drain, the drain being coupled to a bias voltage and to the applying means of the output loop, and the gate being coupled to the crystal in the oscillator loop;

means, including a capacitance, for increasing the capacitance in the oscillator loop with decreasing operating temperatures of the oscillator circuit, the capacitance increasing means being coupled between the drain of the transistor circuit and the crystal to complete the oscillator loop from the drain of the transistor circuit through the crystal to the gate of the transistor circuit and through the transistor circuit to its drain; and means coupled between the source of the transistor circuit and ground return for the bias voltage, for increasingly limiting a current flow through the transistor circuit with decreasing operating temperatures of the oscillator circuit.

2. An improvement according to claim 1, wherein the current limiting means includes a resistive element which has a value of less than 20 ohms at a temperature of 60°C and of more than 700 ohms at a temperature of −40°C, and a by-pass capacitor in parallel with the resistive element for preventing signal voltage from becoming affected by the resistive element, the oscillator circuit further including a diode coupled in series to the by-pass capacitor and the resistive element of the current limiting means to prevent a conventional current flow into the source of the transistor circuit.

3. In an oscillator circuit having an oscillator loop including a piezoelectric crystal to generate oscillating signals, an output loop including means for inducing signals from the output loop in a signal line, and an active element for transferring the signals generated in the oscillator loop to the output loop, a temperature-compensated field-effect transistor device for replacing a vacuum tube as the active element in the oscillator circuit, which comprises:

a field-effect transistor amplifier having a source, a gate and a drain corresponding to a cathode, a control grid and a plate of the tube, respectively, the gate being coupled to a first contact corresponding to a control grid termination of the tube, the first contact being coupled to a first terminal of the crystal, and the drain being coupled to a second contact corresponding to the plate of the tube, the second contact being coupled to a bias voltage and to the inducing means of the output loop;

a first impedance, including a capacitance having a negative temperature coefficient, coupled to the drain of the amplifier and terminating in a third contact corresponding to a screen grid termination of the tube the third contact being coupled to a second side of the crystal; and a second impedance including a resistive element with a negative temperature coefficient coupled to the source of the amplifier and terminating in a fourth contact corresponding to the cathode termination of the tube, the fourth contact being coupled to a ground return for the bias voltage.

4. A crystal oscillator circuit having an oscillator loop, including a capacitance and a piezoelectric crystal to provide oscillating signals, an output loop including means for applying signals to a signal line, and an active element comprised of a junction field-effect transistor network having source, gate and drain terminals, the drain terminal being coupled to a bias voltage source, to a first terminal of the crystal, and to the applying means of the output loop, and the gate being coupled to a second terminal of the crystal in the oscillator loop, the circuit comprising:

a capacitive impedance having a negative temperature coefficient inserted into the oscillator loop of the circuit, the capacitive temperature coefficient defining a change in capacitance of at least 1,000 parts per million per degree centigrade;

an impedance comprising a capacitor in parallel to a resistor having a negative temperature coefficient, inserted into the output loop, the resistor having a value of less than 20 ohms at a temperature of 60° centigrade and of more than 700 ohms at a temperature of negative 40° centigrade; and a diode in the output loop of the circuit having an anode coupled to the source terminal of the network.

* * * * *